(12) United States Patent
Sakai et al.

(10) Patent No.: US 11,014,357 B2
(45) Date of Patent: May 25, 2021

(54) PIEZOELECTRIC ELEMENT, LIQUID DISCHARGE HEAD, AND PRINTER

(71) Applicant: SEIKO EPSON CORPORATION, Tokyo (JP)

(72) Inventors: Tomohiro Sakai, Matsumoto (JP); Kazuya Kitada, Matsumoto (JP); Yasumi Ikehara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/774,605

(22) Filed: Jan. 28, 2020

(65) Prior Publication Data

US 2020/0238702 A1  Jul. 30, 2020

(30) Foreign Application Priority Data

Jan. 30, 2019 (JP) .............................. JP2019-014164

(51) Int. Cl.
*B41J 2/14* (2006.01)
*B41J 2/045* (2006.01)

(52) U.S. Cl.
CPC ....... *B41J 2/14201* (2013.01); *B41J 2/04581* (2013.01)

(58) Field of Classification Search
CPC .. B41J 2/14201; B41J 2/04581; B41J 2/1623; B41J 2/1626; B41J 2/1631; B41J 2/1642; B41J 2/1645; B41J 2/1646; B41J 2/161; B41J 2002/14241; B41J 2002/14362; B41J 2202/03; B41J 2/14233; H01L 41/27
USPC ........................................................ 347/68
See application file for complete search history.

(56) References Cited

U.S. PATENT DOCUMENTS

| 8,529,025 | B2 * | 9/2013 | Kitada | B41J 2/1632 347/68 |
|---|---|---|---|---|
| 10,186,652 | B2 * | 1/2019 | Sakai | H01L 41/04 |
| 2011/0109701 | A1 * | 5/2011 | Ohashi | H01L 41/0478 347/68 |
| 2012/0147098 | A1 * | 6/2012 | Kitada | B41J 2/1645 347/71 |
| 2017/0229637 | A1 | 8/2017 | Sakai et al. | |

FOREIGN PATENT DOCUMENTS

| JP | 2008-270379 | 11/2008 |
|---|---|---|
| JP | 2008-270514 | 11/2008 |
| JP | 2017-143260 | 8/2017 |

* cited by examiner

*Primary Examiner* — Huan H Tran
*Assistant Examiner* — Alexander D Shenderov
(74) *Attorney, Agent, or Firm* — Workman Nydegger

(57) ABSTRACT

A piezoelectric element includes: a first electrode and a second electrode; and a piezoelectric layer provided between the first electrode and the second electrode, where: the piezoelectric layer contains a complex oxide having a perovskite structure and including potassium, sodium, and niobium; on a cross-section of the piezoelectric layer, a standard deviation of values that are obtained by normalizing sodium atom concentrations in eight regions by an average value of the sodium atom concentrations in the eight regions is 0.140 or less; each of the regions includes a central line of the piezoelectric layer; each of the regions is a square having a size in a thickness direction of the piezoelectric layer and a size in a direction orthogonal to the thickness direction of 150 nm; and the eight regions are aligned in the direction orthogonal to the thickness direction.

4 Claims, 9 Drawing Sheets

FIG. 6

|  | No.1 | No.2 | No.3 | No.4 | No.5 | No.6 | No.7 | No.8 | MAX | MIN | MAX−MIN | $\sigma_K$ |
|---|---|---|---|---|---|---|---|---|---|---|---|---|
| EX. 1 | 1.076 | 0.981 | 1.061 | 0.962 | 0.867 | 1.018 | 1.051 | 0.985 | 1.076 | 0.867 | 0.209 | 0.0679 |
| COMP. EX. 1 | 1.283 | 1.109 | 1.291 | 1.020 | 0.741 | 0.774 | 0.926 | 0.856 | 1.291 | 0.741 | 0.550 | 0.2142 |

FIG. 8

|  | No.1 | No.2 | No.3 | No.4 | No.5 | No.6 | No.7 | No.8 | MAX | MIN | MAX-MIN | $\sigma_{Na}$ |
|---|---|---|---|---|---|---|---|---|---|---|---|---|
| EX. 1 | 0.898 | 1.036 | 0.829 | 1.118 | 1.193 | 0.870 | 0.946 | 1.108 | 1.193 | 0.829 | 0.364 | 0.1329 |
| COMP. EX. 1 | 0.845 | 0.858 | 0.679 | 0.908 | 1.225 | 1.256 | 1.156 | 1.073 | 1.256 | 0.679 | 0.577 | 0.2074 |

PIEZOELECTRIC ELEMENT, LIQUID DISCHARGE HEAD, AND PRINTER

The present application is based on, and claims priority from JP Application Serial Number 2019-014164, filed Jan. 30, 2019, the disclosure of which is hereby incorporated by reference herein in its entirety.

BACKGROUND

1. Technical Field

The present disclosure relates to a piezoelectric element, a liquid discharge head, and a printer.

2. Related Art

A piezoelectric element includes a piezoelectric layer that exhibits electromechanical conversion characteristics and two electrodes sandwiching the piezoelectric layer. Such a piezoelectric element is mounted, for example, on a liquid discharge head, typified by an ink jet-mode recording head.

For example, JP-A-2017-143260 discloses that potassium sodium niobate ((K,Na)NbO$_3$: KNN) is used as a material for a piezoelectric layer of a piezoelectric element.

In a piezoelectric element including a piezoelectric layer formed of the above-mentioned KNN-based material, cracking occurred in the piezoelectric layer in some cases when the thickness of the piezoelectric layer was increased.

SUMMARY

An embodiment of a piezoelectric element according to the present disclosure includes: a first electrode and a second electrode; and a piezoelectric layer provided between the first electrode and the second electrode, where: the piezoelectric layer contains a complex oxide having a perovskite structure and including potassium, sodium, and niobium; on a cross-section of the piezoelectric layer, a standard deviation of values that are obtained by normalizing sodium atom concentrations in eight regions by an average value of the sodium atom concentrations in the eight regions is 0.140 or less; each of the regions includes a central line of the piezoelectric layer; each of the regions is a square having a size in a thickness direction of the piezoelectric layer and a size in a direction orthogonal to the thickness direction of 150 nm; and the eight regions are aligned in the direction orthogonal to the thickness direction.

In the embodiment of the piezoelectric element, a standard deviation of values that are obtained by normalizing potassium atom concentrations in the eight regions by an average value of the potassium atom concentrations in the eight regions may be 0.070 or less.

An embodiment of a liquid discharge head according to the present disclosure includes: the embodiment of the piezoelectric element; a channel-formed substrate provided with a pressure chamber that changes a volume by the piezoelectric element and a supply channel that is connected with the pressure chamber and that supplies a liquid to the pressure chamber; and a nozzle plate provided with a nozzle hole that is connected with the pressure chamber and that discharges the liquid.

An embodiment of a printer according to the present disclosure includes: the embodiment of the liquid discharge head; a transport mechanism that moves a recording medium relative to the liquid discharge head; and a control unit that controls the liquid discharge head and the transport mechanism.

BRIEF DESCRIPTION OF THE DRAWINGS

FIG. 6 is a table showing values obtained by normalizing potassium atom concentrations in eight regions by an average value of the potassium atom concentrations in the eight regions, the maximum value and the minimum value, a difference between the maximum value and the minimum value, and the standard deviation.

FIG. 8 is a table showing values obtained by normalizing sodium atom concentrations in the eight regions by an average value of the sodium atom concentrations in the eight regions, the maximum value and the minimum value, a difference between the maximum value and the minimum value, and the standard deviation.

DESCRIPTION OF EXEMPLARY EMBODIMENTS

Hereinafter, preferable embodiments of the present disclosure will be described in detail by means of the drawings. However, the embodiments described hereinafter do not unreasonably limit the content of the present disclosure recited in the claims. Moreover, all the constitution described hereinafter is not necessarily the essential constitution required for the present disclosure.

1. Piezoelectric Element

Figure 1:
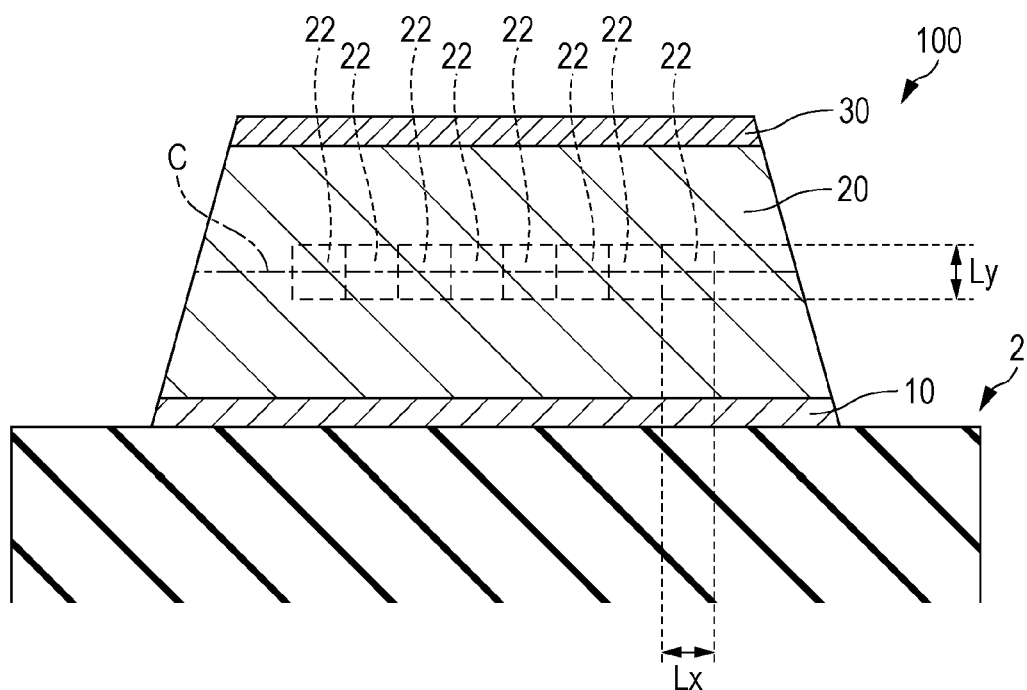
FIG. 1 is a cross-sectional view schematically illustrating a piezoelectric element according to an embodiment.

First, a piezoelectric element according to an embodiment will be described with reference to the drawings. FIG. 1 is a cross-sectional view schematically illustrating a piezoelectric element 100 according to an embodiment.

As illustrated in FIG. 1, the piezoelectric element 100 includes a first electrode 10, a piezoelectric layer 20, and a second electrode 30. The piezoelectric element 100 is provided on a substrate 2.

The substrate 2 is a flat sheet formed of a semiconductor or an insulator, for example. The substrate 2 may be a single layer or a layered structure of a plurality of stacked layers. The inner structure of the substrate 2 is not limited provided that the upper surface has a planar shape and may be a structure in which a space or the like is formed inside.

The substrate 2 may be a diaphragm that exhibits flexibility and deforms by the action of the piezoelectric layer 20. The diaphragm is a silicon oxide layer, a zirconium oxide layer, or a layered structure of a zirconium oxide layer provided on a silicon oxide layer, for example.

The first electrode 10 is provided on the substrate 2. The shape of the first electrode 10 is a layered one, for example. The thickness of the first electrode 10 is 3 nm or more and 200 nm or less, for example. The first electrode 10 is a metal layer, such as a platinum layer or an iridium layer; a conducting oxide layer thereof; or a strontium ruthenate ($SrRuO_3$: SRO) layer, for example. The first electrode 10 may have a structure in which a plurality of the above-mentioned exemplary layers are stacked.

The first electrode 10 is either of electrodes for applying voltage to the piezoelectric layer 20. The first electrode 10 is a lower electrode provided below the piezoelectric layer 20.

Although not shown, a bonding layer for enhancing adhesion between the first electrode 10 and the substrate 2 may be provided between the first electrode 10 and the substrate 2. The bonding layer is a titanium layer or a titanium oxide layer, for example.

The piezoelectric layer 20 is provided on the first electrode 10. The thickness of the piezoelectric layer 20 is not particularly limited and is 100 nm or more and 3 µm or less, for example, and preferably 450 nm or more and 2 µm or less. When the thickness of the piezoelectric layer 20 is set to 450 nm or more, for example, the displacement of a diaphragm can be increased. The piezoelectric layer 20 is provided between the first electrode 10 and the second electrode 30. The piezoelectric layer 20 can be deformed by applying voltage between the first electrode 10 and the second electrode 30.

The piezoelectric layer 20 contains a complex oxide having a perovskite structure and including potassium (K), sodium (Na), and niobium (Nb). The piezoelectric layer 20 is a KNN layer formed of KNN, for example. The piezoelectric layer 20 may further contain manganese (Mn). By incorporating manganese into the piezoelectric layer 20, the leakage current of the piezoelectric element 100 can be reduced. As described here, the piezoelectric layer may contain an additive other than potassium, sodium, niobium, and oxygen (O).

The piezoelectric layer 20 is formed, for example, by stacking a plurality of layers. The number of such layers is not particularly limited and is 6 or more and 30 or less, for example, and preferably 10 or more and 20 or less.

On a cross-section of the piezoelectric layer 20, a standard deviation $\sigma_{Na}$ of values that are obtained by normalizing sodium atom concentrations in eight regions 22 by an average value $A_{Na}$ of the sodium atom concentrations in the eight regions 22 is 0.140 or less, for example, and preferably 0.133 or less. Specifically, the standard deviation $\sigma_{Na}$ is a standard deviation of values that are obtained by normalizing the sodium atom concentrations in the eight regions 22 by the average value $A_{Na}$ as "1". A difference between the maximum value and the minimum value of the values obtained by normalizing the sodium atom concentrations in the eight regions 22 by the average value $A_{Na}$ is 0.40 or less, for example.

On the cross-section of the piezoelectric layer 20, a standard deviation $\sigma_K$ of values that are obtained by normalizing potassium atom concentrations in the eight regions 22 by an average value $A_K$ of the potassium atom concentrations in the eight regions 22 is 0.070 or less and preferably 0.068 or less. Specifically, the standard deviation $\sigma_K$ is a standard deviation of values that are obtained by normalizing the potassium atom concentrations in the eight regions 22 by the average value $A_K$ as "1". A difference between the maximum value and the minimum value of the values obtained by normalizing the potassium atom concentrations in the eight regions 22 by the average value $A_K$ is 0.30 or less, for example.

Here, the cross-section of the piezoelectric layer 20 is a cross-section parallel to the thickness direction of the piezoelectric layer 20. Hereinafter, the thickness direction of the piezoelectric layer 20 is also simply referred to as the "thickness direction" whereas a direction orthogonal to the thickness direction is also referred to as an "in-plane direction".

Each of the regions 22 includes the central line C of the piezoelectric layer 20 on the cross-section of the piezoelectric layer 20. The central line C is a line equidistant from the first electrode 10 and the second electrode 30 in a portion of the piezoelectric layer 20 sandwiched between the first electrode 10 and the second electrode 30.

Each of the regions 22 is a square. In the illustrated example, the center of each region 22 is positioned on the central line C. The size Ly of each region 22 in the thickness direction is 150 nm, and the size Lx of each region 22 in the in-plane direction is 150 nm. The eight regions 22 are aligned in the in-plane direction to form a row. The neighboring regions 22 are in contact with each other. The size in the in-plane direction of the row formed from the eight regions 22 is 1,200 nm.

The second electrode 30 is provided on the piezoelectric layer 20. Although not shown, the second electrode 30 may be further provided on the side surface of the piezoelectric layer 20 and on the substrate 2.

The shape of the second electrode 30 is a layered one, for example. The thickness of the second electrode 30 is 15 nm or more and 300 nm or less, for example. The second electrode 30 is a metal layer, such as an iridium layer or a platinum layer; a conducting oxide layer thereof; or a strontium ruthenate layer, for example. The second electrode 30 may have a structure in which a plurality of the above-mentioned exemplary layers are stacked.

The second electrode 30 is the other electrode for applying voltage to the piezoelectric layer 20. The second electrode 30 is an upper electrode provided on the piezoelectric layer 20.

The piezoelectric element 100 has the following features, for example.

In the piezoelectric element 100, the standard deviation $\sigma_{Na}$ of values that are obtained by normalizing the sodium atom concentrations in the eight regions 22 by the average value $A_{Na}$ of the sodium atom concentrations in the eight regions 22 is 0.140 or less. Consequently, the piezoelectric element 100 can suppress the occurrence of cracking compared with a case in which the standard deviation $\sigma_{Na}$ is larger than 0.140 as in "5. Examples and Comparative Examples" section described hereinafter.

In the piezoelectric element 100, the standard deviation $\sigma_K$ of values that are obtained by normalizing the potassium atom concentrations in the eight regions 22 by the average value $A_K$ of the potassium atom concentrations in the eight regions 22 is 0.070 or less. Consequently, the piezoelectric element 100 can suppress the occurrence of cracking compared with a case in which the standard deviation $\sigma_K$ is larger than 0.070 as in "5. Examples and Comparative Examples" section described hereinafter.

2. Manufacturing Method for Piezoelectric Element

Next, a manufacturing method for the piezoelectric element 100 according to the embodiment will be described with reference to the drawings.

As illustrated in FIG. 1, the substrate 2 is prepared. Specifically, a silicon oxide layer is formed by thermally oxidizing a silicon substrate. Subsequently, a zirconium oxide layer is formed by depositing a zirconium layer on the silicon oxide layer by sputtering or the like and thermally oxidizing the zirconium layer. Through the above steps, the substrate 2 can be prepared.

Next, the first electrode 10 is formed on the substrate 2. The first electrode 10 is formed by sputtering or vacuum vapor deposition, for example. The first electrode 10 is then patterned by photolithography and etching, for example.

Subsequently, the piezoelectric layer 20 is formed on the first electrode 10. The piezoelectric layer 20 is formed, for example, by a chemical solution deposition (CSD), such as a sol-gel process or metal-organic deposition (MOD). Hereinafter, a forming method for the piezoelectric layer 20 will be described.

First, a precursor solution is prepared, for example, by dissolving or dispersing in an organic solvent a metal complex containing potassium, a metal complex containing sodium, and a metal complex containing niobium.

Examples of the metal complex containing potassium include potassium 2-ethylhexanoate and potassium acetate. Examples of the metal complex containing sodium include sodium 2-ethylhexanoate and sodium acetate. Examples of the metal complex containing niobium include niobium 2-ethylhexanoate, pentaethoxyniobium, and pentabutoxyniobium. Here, two or more metal complexes may be used in combination. For example, potassium 2-ethylhexanoate and potassium acetate may be used in combination as the metal complex containing potassium.

Examples of the solvent include propanol, butanol, pentanol, hexanol, octanol, ethylene glycol, propylene glycol, octane, decane, cyclohexane, xylene, toluene, tetrahydrofuran, acetic acid, 2-ethylhexanoic acid, 2-n-butoxyethanol, n-octane, 3-methylheptane, and mixed solvents thereof.

Next, the prepared precursor solution is applied to the first electrode 10 by spin coating or the like, thereby forming a precursor layer. The precursor layer is then dried for a certain time by heating at 130° C. or higher and 250° C. or lower, for example. The dried precursor layer is degreased, for example, by further heating at 300° C. or higher and 450° C. or lower and retaining for a certain time. Subsequently, the degreased precursor layer is fired at 750° C. or higher and 800° C. or lower, for example, and is crystallized by retaining the firing temperature for 4 minutes or more and 8 minutes or less. When the firing time is longer than 8 minutes, at least either of potassium and sodium vaporizes in some cases.

Through the above steps, a layer that constitutes the piezoelectric layer 20 can be formed. Further, the above-described series of steps from the application of the precursor solution to the firing of the precursor layer are repeated a plurality of times. As a result, a piezoelectric layer composed of a plurality of layers can be formed.

A heating apparatus used for drying and degreasing the precursor layer is a hot plate, for example. A heating apparatus used for firing of the precursor layer is a rapid thermal annealing (RTA) apparatus that performs heating by irradiating with an infrared lamp.

Next, the second electrode 30 is formed on the piezoelectric layer 20. The second electrode 30 is formed by sputtering or vacuum vapor deposition, for example. The second electrode 30 and the piezoelectric layer 20 are then patterned by photolithography and etching, for example. Here, the second electrode 30 and the piezoelectric layer 20 may be patterned in separate steps. Moreover, after the step of forming the second electrode 30, heating may be performed at a temperature lower than the firing temperature of the precursor layer.

Through the above steps, the piezoelectric element 100 can be manufactured.

3. Liquid Discharge Head

Figure 2:
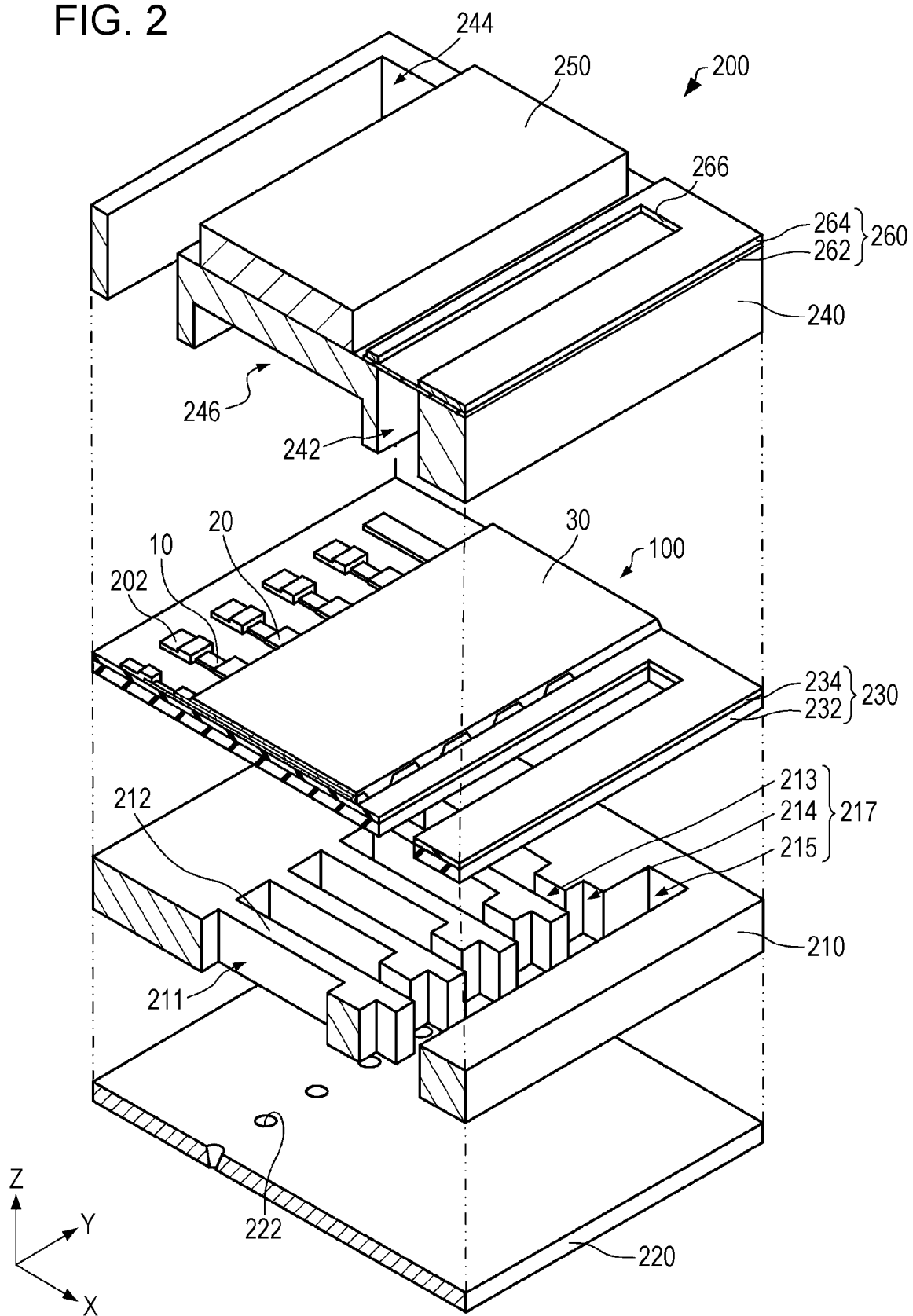
FIG. 2 is an exploded perspective view schematically illustrating a liquid discharge head according to an embodiment.
Figure 3:
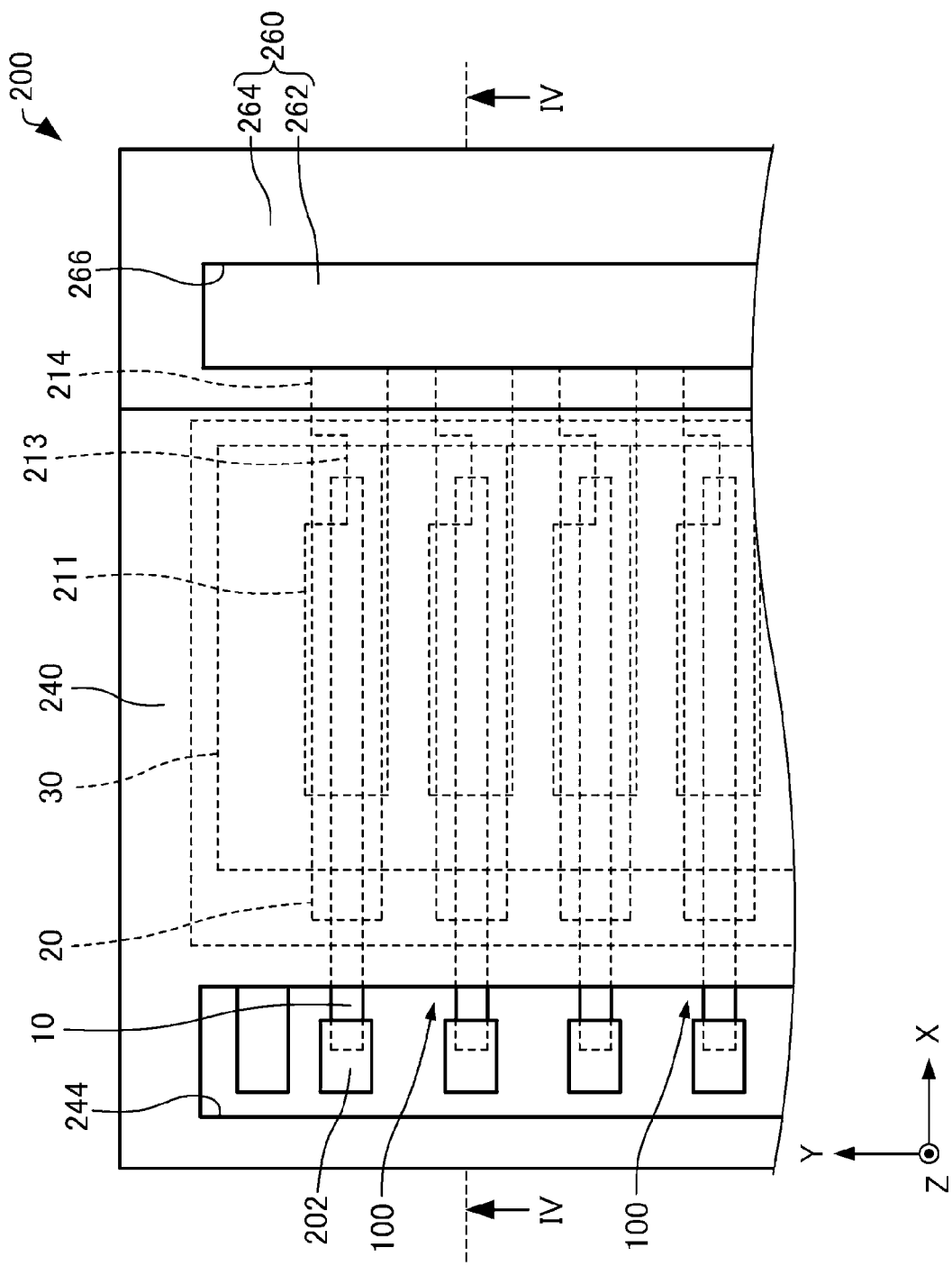
FIG. 3 is a plan view schematically illustrating the liquid discharge head according to the embodiment.
Figure 4:
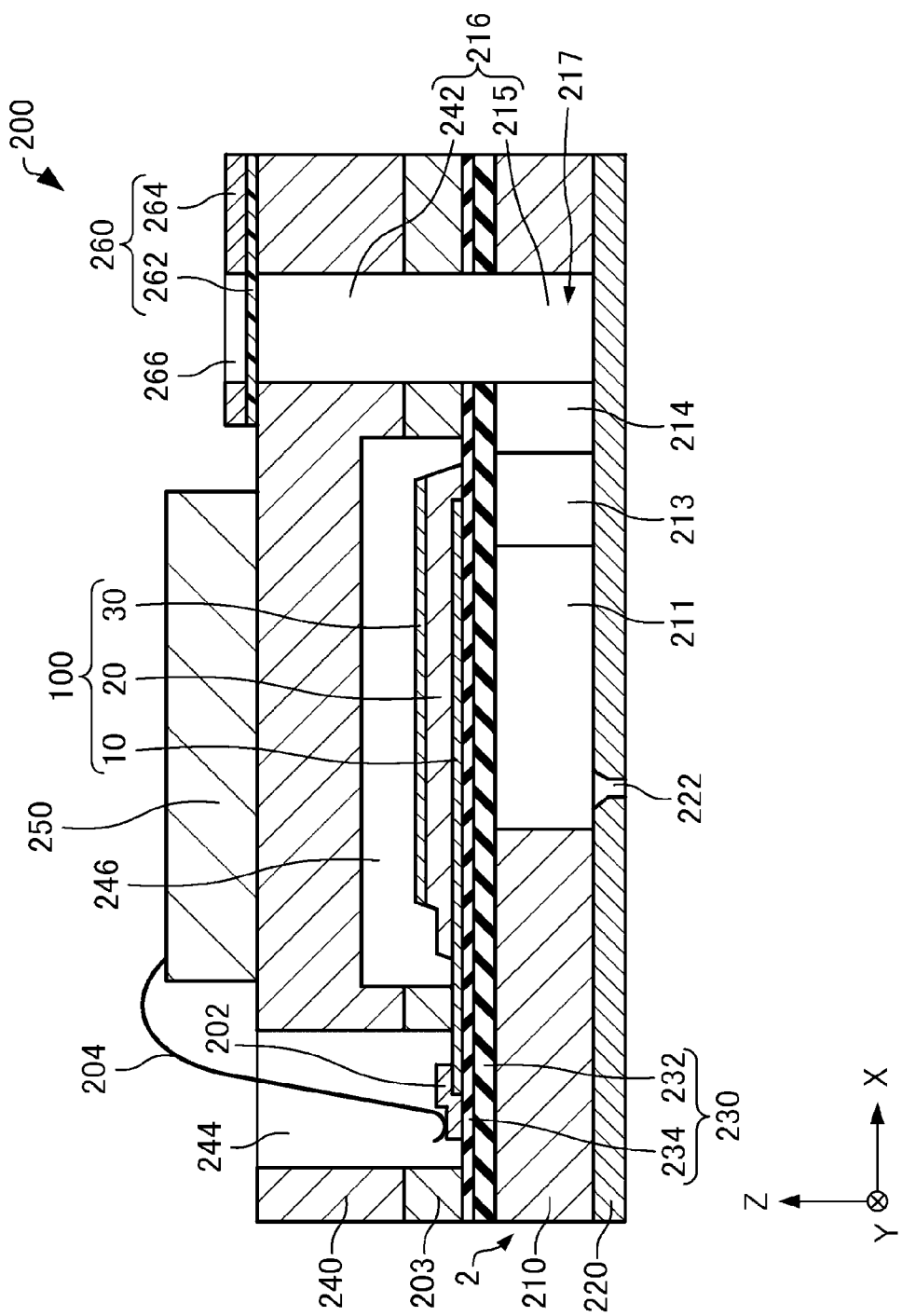
FIG. 4 is a cross-sectional view schematically illustrating the liquid discharge head according to the embodiment.

Next, a liquid discharge head according to an embodiment will be described with reference to the drawings. FIG. 2 is an exploded perspective view schematically illustrating a liquid discharge head 200 according to an embodiment. FIG. 3 is a plan view schematically illustrating the liquid discharge head 200 according to the embodiment. FIG. 4 is a cross-sectional view along line IV-IV of FIG. 3 schematically illustrating the liquid discharge head 200 according to the embodiment. Here, in FIGS. 2 to 4, the X-axis, the Y-axis, and the Z-axis are illustrated as three mutually orthogonal axes. Moreover, In FIGS. 2 and 4, the piezoelectric element 100 is simplified for illustration.

As illustrated in FIGS. 2 to 4, the liquid discharge head 200 include the substrate 2, the piezoelectric element 100, a nozzle plate 220, a protective substrate 240, a circuit board 250, and a compliant substrate 260, for example. The substrate 2 includes a channel-formed substrate 210 and a diaphragm 230. Here, for convenience, the circuit board 250 is omitted from illustration in FIG. 3.

The channel-formed substrate 210 is a silicon substrate, for example. The channel-formed substrate 210 is provided with a pressure chamber 211. The pressure chamber 211 is partitioned by a plurality of partition walls 212. The pressure chamber 211 changes the volume by the piezoelectric element 100.

In the +X-axis direction end of each pressure chamber 211 of the channel-formed substrate 210, a first communicating path 213 and a second communicating path 214 are provided. The first communicating path 213 is formed to reduce the opening area by narrowing the +X-axis direction end of the pressure chamber 211 in the Y-axis direction. The size in the Y-axis direction of the second communicating path 214 is the same as the size in the Y-axis direction of the pressure chamber 211, for example. In the +X-axis direction of the second communicating path 214, a third communicating path 215 connected with a plurality of the second communicating paths 214 is provided. The third communicating path 215 constitutes a part of a manifold 216. The manifold 216 functions as a common liquid chamber among the respective pressure chambers 211. As described above, the channel-formed substrate 210 is provided with the pressure chambers 211 and supply channels 217 composed of the first communicating paths 213, the second communicating paths 214, and the third communicating path 215. The supply channels 217 are connected with the respective pressure chambers 211 and supply a liquid to the pressure chambers 211.

The nozzle plate 220 is provided on one side of the channel-formed substrate 210. The material of the nozzle plate 220 is SUS (steel use stainless), for example. The nozzle plate 220 is joined to the channel-formed substrate 210 by an adhesive or a heat-sealing film, for example. The nozzle plate 220 is provided with a plurality of nozzle holes 222 in the Y-axis. The nozzle holes 222 are connected with the respective pressure chambers 211 and discharge a liquid.

The diaphragm 230 is provided on the other side of the channel-formed substrate 210. The diaphragm 230 is formed, for example, from a silicon oxide layer 232 provided on the channel-formed substrate 210 and a zirconium oxide layer 234 provided on the silicon oxide layer 232.

The piezoelectric element 100 is provided on the diaphragm 230, for example. A plurality of the piezoelectric elements 100 are provided. The number of the piezoelectric elements 100 is not particularly limited.

In the liquid discharge head 200, the diaphragm 230 and the first electrode 10 are displaced by deformation of the piezoelectric layer 20 that exhibits electromechanical conversion characteristics. In other words, in the liquid discharge head 200, the diaphragm 230 and the first electrode 10 substantially function as a diaphragm. Here, the first electrode 10 alone may function as a diaphragm while omitting the diaphragm 230. When the first electrode 10 is directly provided on the channel-formed substrate 210, the first electrode 10 is preferably protected with an insulating protective film to avoid contact of the first electrode 10 with a liquid.

The first electrode 10 is formed as an independent, individual electrode for every pressure chamber 211. The size of the first electrode 10 in the Y-axis direction is smaller than the size of the pressure chamber 211 in the Y-axis direction. The size of the first electrode 10 in the X-axis direction is larger than the size of the pressure chamber 211 in the X-axis direction. In the X-axis direction, both ends of the first electrode 10 are positioned outside both ends of the pressure chamber 211. The −X-axis direction end of the first electrode 10 is coupled to a lead electrode 202.

The size of the piezoelectric layer 20 in the Y-axis direction is larger than the size of the first electrode 10 in the Y-axis direction, for example. The size of the piezoelectric layer 20 in the X-axis direction is larger than the size of the pressure chamber 211 in the X-axis direction, for example. The +X-axis direction end of the piezoelectric layer 20 is positioned outside the +X-axis direction end of the first electrode 10, for example. The +X-axis direction end of the first electrode 10 is covered with the piezoelectric layer 20. Meanwhile, the −X-axis direction end of the piezoelectric layer 20 is positioned inner side of the −X-axis direction end of the first electrode 10, for example. The −X-axis direction end of the first electrode 10 is not covered with the piezoelectric layer 20.

The second electrode 30 is provided, for example, on the piezoelectric layer 20 and the diaphragm 230 in a continuous manner. The second electrode 30 is formed as a common electrode shared by a plurality of the piezoelectric elements 100.

The protective substrate 240 is joined to the channel-formed substrate 210 by an adhesive 203. The protective substrate 240 is provided with a through hole 242. In the illustrated example, the through hole 242 penetrates the protective substrate 240 in the Z-axis direction and is connected with the third communicating path 215. The through hole 242 and the third communicating path 215 constitute the manifold 216 that functions as a common liquid chamber among the respective pressure chambers 211. Moreover, the protective substrate 240 is provided with a through hole 244 that penetrates the protective substrate 240 in the Z-axis direction. In the through hole 244, the ends of the lead electrodes 202 are positioned.

The protective substrate 240 is further provided with an opening 246. The opening 246 is a space for allowing the driving of the piezoelectric elements 100 without interference. The opening 246 may be sealed or not.

The circuit board 250 is provided on the protective substrate 240. The circuit board 250 includes an integrated circuit (IC) for driving the piezoelectric elements 100. The circuit board 250 and the lead electrodes 202 are electrically coupled through connecting wiring 204.

The compliant substrate 260 is provided on the protective substrate 240. The compliant substrate 260 includes a sealing layer 262 provided on the protective substrate 240 and a fixing sheet 264 provided on the sealing layer 262. The sealing layer 262 is a layer for sealing the manifold 216. The sealing layer 262 exhibits flexibility, for example. The fixing sheet 264 is provided with a through hole 266. The through hole 266 penetrates the fixing sheet 264 in the Z-axis direction. The through hole 266 is provided at a position overlapping the manifold 216 when viewed in the Z-axis direction.

4. Printer

Figure 5:
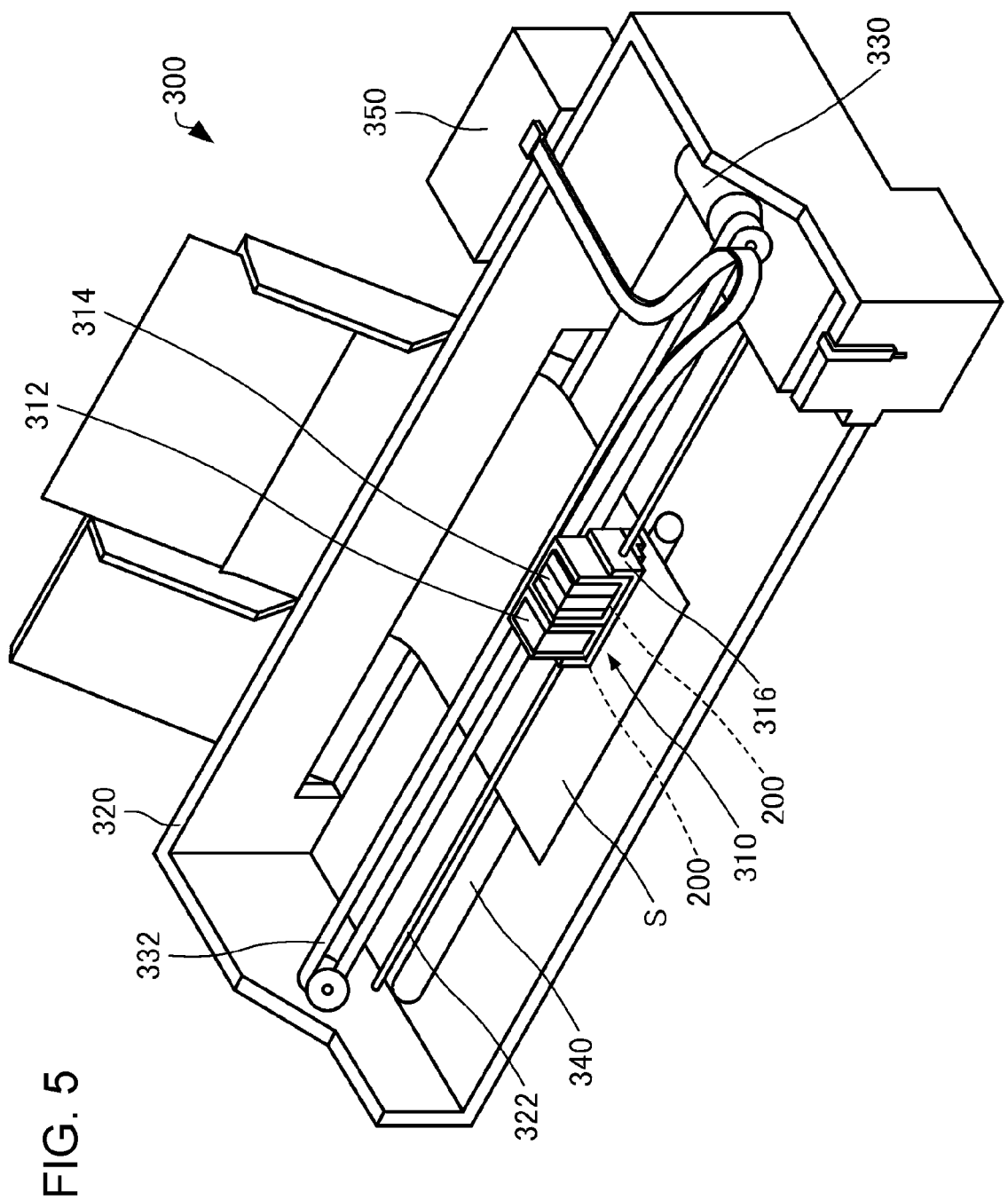
FIG. 5 is a perspective view schematically illustrating a printer according to an embodiment.

Next, a printer according to an embodiment will be described with reference to the drawings. FIG. 5 is a perspective view schematically illustrating a printer 300 according to an embodiment.

The printer 300 is an ink jet-mode printer. The printer 300 includes a head unit 310, as illustrated in FIG. 5. The head unit 310 includes liquid discharge heads 200, for example. The number of the liquid discharge heads 200 is not particularly limited. The head unit 310 is provided with detachable cartridges 312 and 314 that constitute a supply means. A carriage 316, on which the head unit 310 is mounted, is provided on a carriage shaft 322, which is fixed to an apparatus body 320, so as to be freely movable in the axial direction and discharges a liquid supplied from the liquid supply means.

A liquid herein may be a material in a state where a substance is in the liquid phase, and a material in the liquid state, such as sol or gel, is also included in the liquid. Moreover, such liquids encompass, for example, not only a liquid as a state of a substance, but also a solvent in which particles of a solid functional material, such as pigment or metal particles, are dissolved, dispersed, or mixed. Representative examples of liquids include ink and liquid crystal emulsifiers. The ink herein encompasses various liquid compositions, such as common aqueous ink and oil-based ink, gel ink, and hot-melt ink.

In the printer 300, the carriage 316, on which the head unit 310 is mounted, is moved along the carriage shaft 322 by transmitting driving force of a driving motor 330 to the carriage 316 through a plurality of gears not shown and a timing belt 332. Meanwhile, the apparatus body 320 is provided with a transport roller 340 as a transport mechanism for moving a sheet S, which is paper or other recording media, relative to the liquid discharge head. The transport mechanism for transporting the sheet S is not limited to a transport roller and may be a belt, a drum, or the like.

The printer 300 includes a printer controller 350 as a control unit for controlling the liquid discharge heads 200 and the transport roller 340. The printer controller 350 is electrically coupled to circuit boards 250 of the liquid discharge heads 200. The printer controller 350 is equipped with RAM (random access memory) for temporarily storing various data, ROM (read only memory) that stores control programs and the like, CPU (central processing unit), and a driving signal generator circuit for generating driving signals to be supplied to the liquid discharge heads 200, for example.

It is noted that the piezoelectric element 100 is applicable to a wide range of uses other than a liquid discharge head and a printer. The piezoelectric element 100 can be suitably used for various sensors, such as a gyro sensor and an acceleration sensor; timing devices, such as a tuning fork oscillator; and ultrasonic devices, such as an ultrasonic motor.

5. Examples and Comparative Examples

Hereinafter, the present disclosure will be further specifically described by means of Examples and Comparative Examples. The present disclosure, however, is by no means limited by the following Examples and Comparative Examples.

5.1. Preparation of Samples

5.1.1. Example 1

A silicon dioxide layer was formed on a silicon substrate by thermally oxidizing the surface of the silicon substrate. A zirconium oxide layer was then formed by depositing a zirconium layer on the silicon dioxide layer by sputtering and thermally oxidizing the zirconium layer.

Next, a piezoelectric layer was formed on the zirconium oxide layer according to the following procedure.

First, a precursor solution with a metal element concentration of 0.6 M/L was prepared by mixing a 2-n-butoxy-ethanol solution of potassium acetate, an n-octane solution of sodium acetate, and a 3-methylheptane solution of pentaethoxyniobium. In the precursor solution, a ratio of potassium to sodium atom concentrations was K:Na=1:1.

The prepared precursor solution was then applied to the zirconium oxide layer by spin coating at 3,000 rpm. Subsequently, the silicon substrate was placed on a hot plate and dried at 180° C. for 2 minutes. The silicon substrate on the hot plate was then degreased at 350° C. for 2 minutes, followed by firing in an RTA apparatus at 750° C. for 4 minutes. Through these steps, one 75 nm-thick layer was formed.

After that, the above-described series of steps from the application of the precursor solution to the firing were repeated 13 times to form a 1,050 nm-thick 14-layered piezoelectric layer.

5.1.2. Comparative Example 1

Comparative Example 1 is the same as Example 1 except for performing firing in an RTA apparatus at 750° C. for 3 minutes and forming a 375 nm-thick 5-layered piezoelectric layer.

When a 450 nm-thick 6-layered piezoelectric layer was formed through firing in an RTA apparatus at 750° C. for 3 minutes, cracking occurred in the piezoelectric layer. This reveals that Example 1 in which the firing time was set to 4 minutes is less likely to cause cracking compared with Comparative Example 1 in which the firing time was set to 3 minutes.

5.2. Evaluation Method

Each of the above-described samples was processed with a "Helios" FIB (focused ion beam) apparatus from FEI Company to expose the cross-section of the piezoelectric layer. Subsequently, the cross-section of the piezoelectric layer was subjected to compositional mapping by EDX (energy dispersive X-ray spectrometry) with an "HD-2000" S-TEM (scanning transmission electron microscope) from Hitachi, Ltd. to yield information about two-dimensional composition distribution of potassium and sodium.

In the compositional mapping, a region including the center in the thickness direction and having a size in the in-plane direction of 1,200 nm was cut out from any field of view, divided into eight regions, and analyzed for atom concentrations in the eight regions. Each of the eight regions has a size in the in-plane direction of 150 nm and a size in the thickness direction of 150 nm. By setting the cumulative intensity within each region as one datum, eight data about potassium and sodium were obtained in the in-plane direction.

5.3. Evaluation Results

Figure 7:
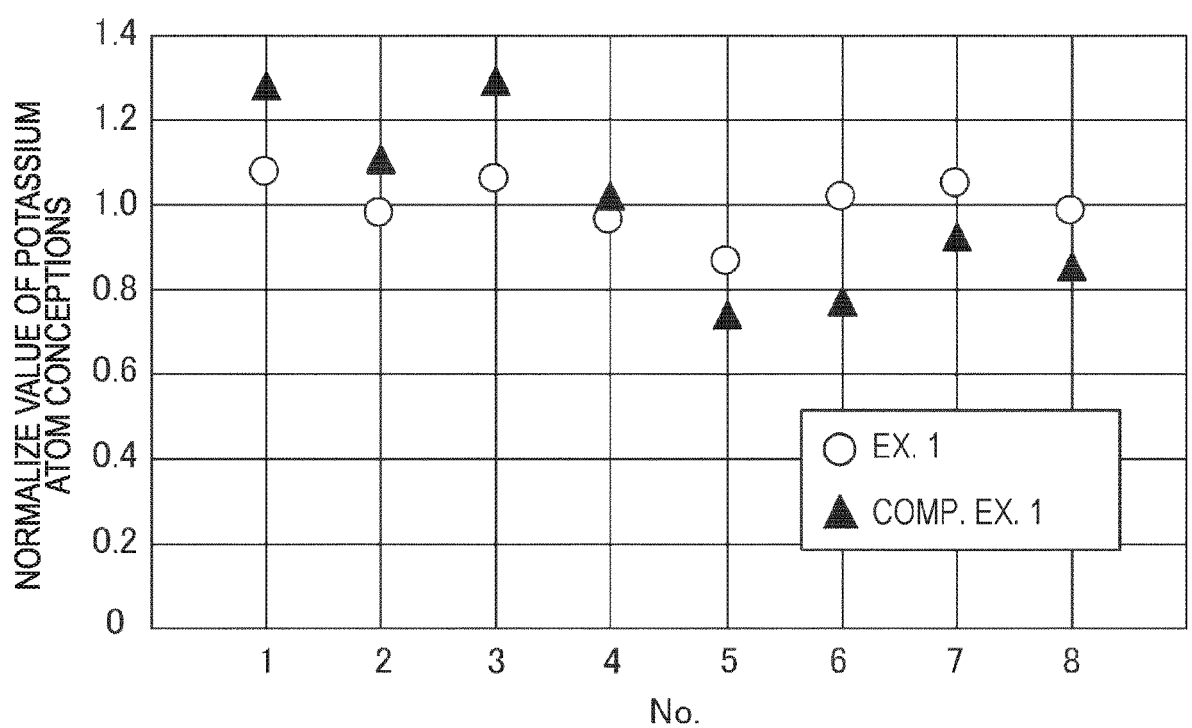
FIG. 7 is a graph on which the values obtained by normalizing potassium atom concentrations in the eight regions by the average value of the potassium atom concentrations in the eight regions are plotted.

FIG. 6 is a table showing values obtained by normalizing potassium atom concentrations in the eight regions by an average value of the potassium atom concentrations in the eight regions, the maximum value and the minimum value, a difference between the maximum value and the minimum value, and the standard deviation $\sigma_K$. FIG. 7 is a graph on which the values obtained by normalizing potassium atom concentrations in the eight regions by the average value of the potassium atom concentrations in the eight regions are plotted.

Figure 9:
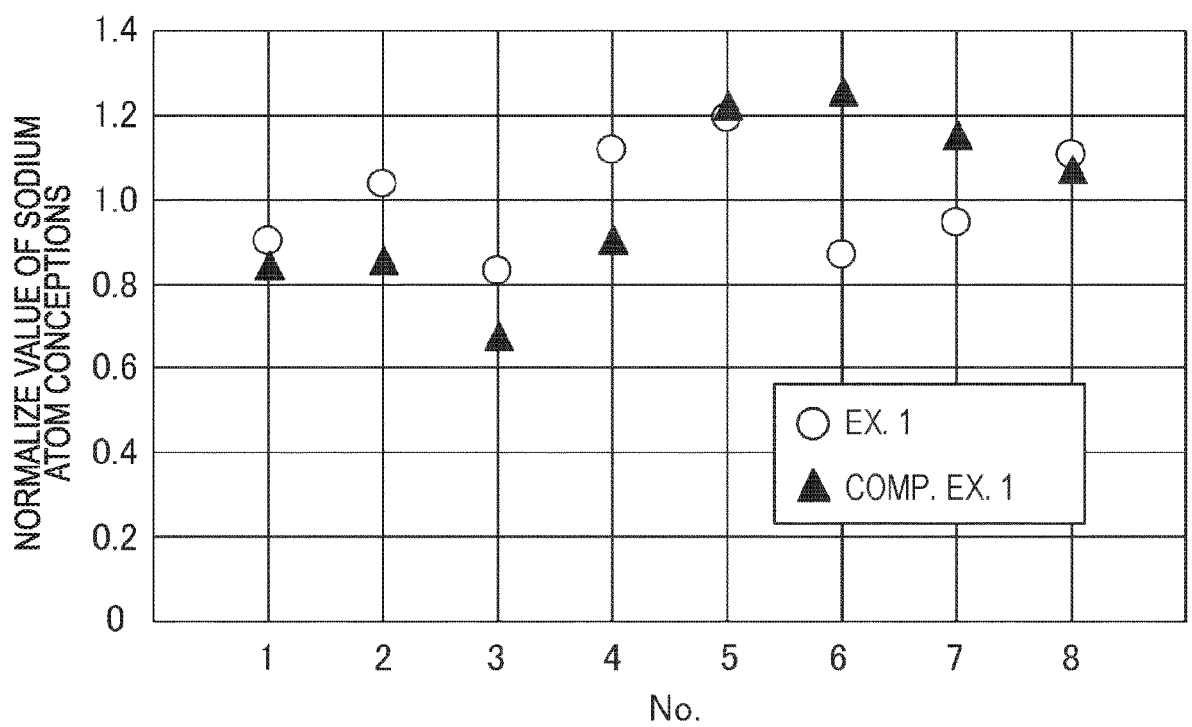
FIG. 9 is a graph on which the values obtained by normalizing sodium atom concentrations in the eight regions by the average value of the sodium atom concentrations in the eight regions are plotted.

FIG. 8 is a table showing values obtained by normalizing sodium atom concentrations in the eight regions by an average value of the sodium atom concentrations in the eight regions, the maximum value and the minimum value, a difference between the maximum value and the minimum value, and the standard deviation $\sigma_{Na}$. FIG. 9 is a graph on which the values obtained by normalizing sodium atom concentrations in the eight regions by the average value of the sodium atom concentrations in the eight regions are plotted.

In FIGS. 6 to 9, "No." denotes the number for the regions aligned in the in-plane direction in the order of No. 1 to No. 8. Moreover, in FIGS. 6 and 8, "MAX" and "MIN" represent the maximum value and the minimum value among No. 1 to No. 8, respectively, and "MAX-MIN" represents a difference between the maximum value and the minimum value.

As shown in FIG. 6, the standard deviation $\sigma_K$ of Example 1 was 0.070 or less and smaller than the standard deviation $\sigma_K$ of Comparative Example 1 in which cracking tends to arise. Further, as shown in FIG. 8, the standard deviation $\sigma_{Na}$ of Example 1 was 0.140 or less and smaller than the standard deviation $\sigma_{Na}$ of Comparative Example 1 in which cracking tends to arise.

From the above observation, it was found that when the standard deviation $\sigma_K$ is 0.070 or less, cracking is less likely to occur compared with a case in which the standard deviation $\sigma_K$ is more than 0.070. It was also found that when the standard deviation $\sigma_{Na}$ is 0.140 or less, cracking is less likely to occur compared with a case in which the standard deviation $\sigma_{Na}$ is more than 0.140.

Here, $KNbO_3$ and $NaNbO_3$ that constitute KNN are different in lattice constant by about 2% to 3%. When a potassium or sodium atom concentration varies within a crystal grain, the lattice constant also varies corresponding to the atom concentration. Accordingly, when the continuity of the crystal is retained in the in-plane direction, stress arises in the crystal. When the crystal becomes discontinuous in the in-plane direction to release stress, a defect is formed within the crystal.

Consequently, stress tends to be concentrated and toughness deteriorates. Due to such stress arising between crystal lattices and deterioration in toughness, cracking tends to arise. Therefore, it is concluded that cracking is less likely to occur when, in the in-plane direction, a difference in potassium atom concentration and a difference in sodium atom concentration are smaller and the standard deviation $\sigma_K$ and the standard deviation $\sigma_{Na}$ are smaller.

In general, ceramics exhibit higher toughness toward compressive stress than toward tensile stress. The lattice constant of $KNbO_3$ is larger than the lattice constant of $NaNbO_3$. Accordingly, when KNN is formed, tensile stress arises in $NaNbO_3$. For this reason, to suppress the occurrence of cracking, it is more effective to reduce the standard deviation $\sigma_{Na}$ than to reduce the standard deviation $\sigma_K$.

The present disclosure is not limited to the above-described embodiments and various modifications are further possible. For example, the present disclosure encompasses the constitution substantially the same as the constitution described as the embodiments. The substantially same constitution is the constitution with the same function, method, and results or the constitution with the same object and effects, for example. In addition, the present disclosure encompasses the constitution that is described as the embodiment but is replaced in the nonessential portion. Moreover, the present disclosure encompasses the constitution that exerts the same advantageous effects as the constitution described as the embodiment or the constitution that can attain the same object as the constitution described as the embodiment. Further, the present disclosure encompasses the constitution in which the constitution described as the embodiment is added with a publicly-known technique.

What is claimed is:

1. A piezoelectric element comprising:
   a first electrode; a second electrode; and
   a piezoelectric layer provided between the first electrode and the second electrode, the piezoelectric layer containing a complex oxide, the complex oxide having a perovskite structure and including potassium, sodium, and niobium, wherein
   the piezoelectric layer contains eight regions that each have a square shape that is 150 nm in a thickness direction of the piezoelectric layer and in a direction orthogonal to the thickness direction,
   each of the regions are located on a cross-section of the piezoelectric layer and on a central line of the piezoelectric layer that is a line equidistant from the first electrode and the second electrode in the thickness direction, and
   a standard deviation of standard normal distribution calculated from sodium atom concentrations in eight regions is 0.140 or less.

2. The piezoelectric element according to claim 1, wherein a standard deviation of standard normal distribution calculated from potassium atom concentrations in the eight regions is 0.070 or less.

3. A liquid discharge head comprising:
   the piezoelectric element according to claim 1;
   a channel-formed substrate provided with
      a pressure chamber that changes a volume by the piezoelectric element and
      a supply channel that is connected with the pressure chamber; and
   a nozzle plate provided with a nozzle hole that is connected with the pressure chamber.

4. A printer comprising:
   the liquid discharge head according to claim 3;
   a transport that moves a medium relative to the liquid discharge head; and
   a controller that controls operation of the liquid discharge head and the transport.

* * * * *